United States Patent [19]

Nulty et al.

[11] Patent Number: 5,468,342
[45] Date of Patent: Nov. 21, 1995

[54] METHOD OF ETCHING AN OXIDE LAYER

[75] Inventors: James E. Nulty; Pamela S. Trammel, both of San Jose, Calif.

[73] Assignee: Cypress Semiconductor Corp., San Jose, Calif.

[21] Appl. No.: 234,478

[22] Filed: Apr. 28, 1994

[51] Int. Cl.$^6$ .......................... H01L 21/306; C03C 15/00; B44C 1/22
[52] U.S. Cl. .................. 156/643.1; 156/657.1; 156/659.11; 216/67; 216/75
[58] Field of Search .................. 156/643, 644, 156/651, 657, 659.1, 661.1, 651, 904, 653; 204/192.32, 192.37; 437/238, 241; 216/63, 67, 75

[56] References Cited

U.S. PATENT DOCUMENTS

| | | | |
|---|---|---|---|
| 4,529,476 | 7/1985 | Kawamoto et al. | 156/657 X |
| 4,654,112 | 3/1987 | Douglas et al. | 156/643 |
| 4,758,305 | 7/1988 | Bonifield et al. | 156/643 |
| 4,832,789 | 5/1989 | Cochran et al. | 156/657 X |
| 5,091,047 | 2/1992 | Cleeves et al. | 156/904 X |
| 5,240,554 | 8/1993 | Hori et al. | 156/904 X |
| 5,264,076 | 11/1993 | Cuthbert et al. | 156/657 |
| 5,286,344 | 2/1994 | Blalock et al. | 156/657 |
| 5,356,515 | 10/1994 | Tahara et al. | 156/643 |

OTHER PUBLICATIONS

Edward Pavelcheck, Gary Calabrese, Bruce Dudley, Susan Jones, Peter Freeman, John Bohland, and Roger Sinta, "Process Techniques for Improving Performance of Positive Tone Silylation", SPIE vol. 1925, Jan. 1993, pp. 264–269.

C. A. Spence, S. A. MacDonald, and H. Schlosser, "Silylation of Poly(t-BOC) Styrene Resists: Performance and Mechanisms", U. C. Berkeley and IBM Alameden Research Centre, 14 pages.

T. Fukase, H. Hada, H. Aoki, and T. Kunio, "A Margin–Free Contact Process Using an A1203 Etch–Stop Layer for High Density Devices", Microelectronics Research Laboratories, Nec Corp., IEEE 1992, pp. 33.3.1–33.3.4., IEDM 92–837.

A. Misaka, K. Harafuji, H. Nakagawa, and M. Kubota, "Loading Phenomena In Dry–Etching Process Using a New Adsorption Model", Semiconductor Research Center, Matsushita Electric Ind. Co., Ltd., IEEE 1993, pp. 35.2.1–35.2.4., IEDM 93–857.

*Primary Examiner*—William Powell
*Attorney, Agent, or Firm*—Blakely, Sokoloff, Taylor & Zafman

[57] ABSTRACT

A method of etching openings in oxide layers is disclosed. A hard mask layer is formed on the oxide layer. The hard mask layer is then patterned by a photoresist layer and an etch is performed to form openings in the hard mask. Next, the patterning layer may be removed and an etch is performed to remove the oxide in the regions defined by the hard mask layer openings. The etch with hard mask has minimized aspect ratio dependency, so that openings of different sizes may be formed simultaneously. An etch that may be carried out with Freon 134$a$ ($C_2H_2F_4$) to provide superior oxide:nitride selectivity is also disclosed. Additionally, the etch may be carried out at high temperature for improved wall profile without loss of selectivity. For deep openings, a two step etch process is disclosed, with a polymer clean step between the etches to remove polymer build up from first etch, and allow the etch to proceed to an increased depth.

63 Claims, 17 Drawing Sheets

METHOD OF ETCHING AN OXIDE LAYER

BACKGROUND OF THE INVENTION

1. Field of the Invention

The present invention relates to the field of semiconductor device fabrication and more particularly to improved methods for etching openings in oxide layers.

2. Background Information

In the fabrication of semiconductor devices, numerous conductive device regions and layers are formed in or on a semiconductor substrate. The conductive regions and layers of the device are isolated from one another by a dielectric, for example, silicon dioxide. The silicon dioxide may be grown, or may be deposited by physical deposition (e.g., sputtering) or by a variety of chemical deposition methods and chemistries. Additionally, the silicon dioxide may be undoped or may be doped, for example, with boron, phosphorus, or both, to form for example, borophosphosilicate glass (BPSG), and phosphosilicate glass (PSG). The method of forming the silicon dioxide layer and the doping of the silicon dioxide will depend upon various device and processing considerations. Herein, all such silicon dioxide layers are referred to generally as "oxide" layers.

At several stages during fabrication, it is necessary to make openings in the dielectric to allow for contact to underlying regions or layers. Generally, an opening through a dielectric exposing a diffusion region or an opening through a dielectric layer between polysilicon and the first metal layer is called a "contact opening", while an opening in other oxide layers such as an opening through an inter-metal dielectric layer (ILD) is referred to as a "via". As used herein, an "opening" will be understood to refer to any type of opening through any type of oxide layer, regardless of the stage of processing, layer exposed, or function of the opening.

To form the openings, a patterning layer of photoresist is formed over the oxide layer having openings corresponding to the regions of the oxide where the oxide layer openings are to be formed. In most modern processes a dry etch is performed wherein the wafer is exposed to a plasma, formed in a flow of one or more gases. Typically, one or more halocarbons and/or one or more other halogenated compounds are used as the etchant gas. For example, $CF_4$, $CHF_3$(Freon 23), $SF_6$, $NF_3$, and other gases may be used as the etchant gas. Additionally, gases such as $O_2$, Ar, $N_2$, and others may be added to the gas flow. The particular gas mixture used will depend on, for example, the characteristics of the oxide being etched, the stage of processing, the etch tool being used, and the desired etch characteristics such as, etch rate, wall slope, anisotropy, etc.

Various etch parameters such as the gas mixture, temperature, RF power, pressure, and gas flow rate, among others, may be varied to achieve the desired etch characteristics described above. However, there are invariably tradeoffs between the various desired characteristics. For example, most high performance etches exhibit aspect ratio dependent etch effects (ARDE effects). That is, the rate of oxide removal is dependent upon the aspect ratio of the opening, which can be defined as the ratio of the depth of the opening to the diameter. In general, the oxide etch rate, in terms of linear depth etched per unit time, is much greater for low aspect ratio openings than for high aspect ratio openings. Referring to FIG. 1, substrate 100 represents a semiconductor substrate and any device layers or structures underlying the oxide layer 101 through which the etch is to be performed. For example, there may be a silicon nitride layer ($Si_3N_4$) underlying oxide layer 101. Herein, the term silicon nitride layer or nitride layer is used generally to refer to a layer of $Si_xN_y$, wherein the ratio x:y may or may not be stoichiometric, as well as to various silicon oxynitride films ($Si_xO_yN_z$). As shown, patterning layer 110, which may be a photoresist layer, comprises openings 111 and 112. As can be seen, the diameter of opening 112 is much smaller than that of opening 111. Since the thickness of oxide layer 101 is the same under both openings, the oxide opening under photoresist opening 112 will have a much greater aspect ratio due to its small diameter. As a result of this, as shown in FIG. 1, the prior art etch process causes opening 121 through the oxide layer 101 to be fully etched prior to opening 122. In the prior art, this aspect ratio dependency may be overcome by adjusting the feed gas chemistry, adjusting the operating pressure, increasing the pumping speed to allow for high flow/low pressure operation, and the addition of diluent gases. However, in addition to the cost and time involved in the redesign of the process, these methods of minimizing the aspect ratio dependency typically result in a tradeoff between ARDE effects and other characteristics such as etch rate, selectivity, and profile control, for example. Recently, use of high density plasma (HDP) systems has been proposed to compensate for the ARDE effect. However, these HDP systems are not yet proven in a production mode, and they entail significant capital costs. It should be noted that more advanced technologies demand high etch performance in high aspect ratio features, and demand high etch performance in layers having features with a wide range of aspect ratios. Thus, the ARDE effect constitutes a significant hurdle in advanced applications.

Many of the etch characteristics are generally believed to be affected by polymer residues which deposit during the etch. For this reason, the fluorine to carbon ration (F/C) in the plasma is considered an important determinant in the etch. In general, a plasma with a high F/C ratio will have a faster etch rate than a plasma with a low F/C ratio. At very low ratios, (i.e., high carbon content) polymer deposition occurs and etching ceases. The etch rate as a function of the F/C ratio is typically different for different materials. This difference is used to create a selective etch, by attempting to use a gas mixture which puts the F/C ratio in the plasma at a value that leads to etching at a reasonable rate for one material, and that leads to no etching or polymer deposition for another. For a more thorough discussion of oxide etching, see S. Wolf and R. N. Tauber, *Silicon Processing for the VLSI Era*, Volume 1, pp 539–585 (1986).

By adjusting the feed gases, the taper of the sidewall of the oxide opening can be varied. If a low wall angle is desired, the chemistry is adjusted to try to cause some polymer buildup on the sidewall. Conversely, if a steep wall angle is desired, the chemistry is adjusted to try to prevent buildup on the sidewall. An important problem with changing the etch chemistry is that there is a tradeoff between wall angle and selectivity. That is, etches which provide a near 90° wall angle are typically not highly selective between oxide and an underlying silicon or silicon nitride layer, for example, while highly selective etches typically have a low wall angle. FIG. 2 shows an oxide layer 201 formed on substrate 200, having patterning layer 210 with opening 211 therein. Opening 221 in the oxide layer 201 is shown during formation. In the etch illustrated in FIG. 2, high selectivity may be desired to protect an underlying region of, for example, silicon nitride on the upper surface of substrate 200. It also may be desired to obtain a relativity straight profile. However, if selectivity is to be maintained, the resulting opening 221 will have a taper as shown by angle 206. Often, in a prior art etch with acceptable selectivity, the angle 206 is less than 85°. This tradeoff is particularly severe in etches through thick oxide layers. For example, if the process is engineered to allow for a steep wall profile through a thick BPSG layer, the selectivity will be very poor. While adjustments can be made to improve the wall angle, such as by changing etch chemistry, and other parameters, all processes will suffer from the selectivity tradeoff to some degree. Additionally, such changes will effect other performance goals. For example, as mentioned above, adjustment to the process parameters will have some effect on the ARDE effect. Furthermore, even if adjustments to the etch parameters are found which enhance selectivity without a severe impact on wall angle, such adjustments will involve other tradeoffs. For example, there is typically a tradeoff between selectivity and etch rate, so that increased selectivity may only be had at the expense of throughput. As can be seen, though some adjustments can be made, it is extremely difficult to design an oxide etch which meets all necessary goals. Additionally, it will be appreciated that while the general effects of certain process conditions are known, and the existence of certain tradeoffs can be predicted, it is far from a straightforward matter to precisely tailor an etch or precisely predict the effects changes in the parameters will have. Furthermore, it is often difficult to prevent other undesired consequences of polymer buildup.

FIG. 3 illustrates the effect of polymer buildup during a typical prior art etch process. Polymer buildup along the regions 307 along the sidewalls of opening 321 cause the wall profile to be different than a straight etch profile, shown dashed. Additionally, polymer buildup in the region 308 at the center of the bottom of the opening prevents etching of a portion of the nitride layer 302. However, etching does occur around the outer edges. Thus, the result of the prior art process is poorly controlled wall profile, and non-uniformity of the nitride layer 302 in the bottom of the opening 321. Again, changing the gas chemistry and other etch parameters may be used to improve the etch, but some tradeoffs are inevitable. Additionally, for example, attempts to improve the oxide :nitride selectivity often lead to non-stable plasma conditions, and involve high polymer chemistries, which in turn leads to dirty reactors requiring extensive maintenance, and particle generation which reduces yields.

The above described difficulties in oxide etching make it extremely difficult to form openings over corners of structures. Referring to FIG. 4, opening 411 in patterning layer 410 is aligned to partially overlie structure 404, which may be, for example, a gate, an interconnect line, or other structure. As shown, structure 404 is covered by silicon nitride etch stop layer 403. Typically, the opening 421 is designed to partially overlie structure 404 to a certain extent. Note that as the etch proceeds, opening 421 will extend to the corner of a gate 430 prior to the completion of the etch to the bottom of the opening at 432. As shown, due to the difficulty in achieving a highly selective etch, the nitride layer 403 is removed from structure 404 on the top 430 and side 431, which are exposed to the etch for a significant time before the etch reaches the bottom 432. This problem is particularly severe if the opening 411 is misaligned such that the opening in the oxide layer is formed as shown by dashed lines 421a. The opening 421a exposes a smaller area of nitride layer 403 than the opening 421. This leads to a reduction in the micro-loading effect, which in turn causes the now reduced area of nitride layer 403 to be etched at a much faster rate.

What is needed is a method or methods of etching oxide with reduced ARDE effect, which exhibit a high oxide to nitride selectivity, and which provide control of wall profile. Further, it is preferable that any such methods do not suffer from severe tradeoffs between and among these and other performance goals such as etch rate, so that highly selective etches with reduced sidewall taper and/or reduced ARDE effects, may be achieved. The method or methods should enable the formation of openings which lie on or over other structures, such as in a self-aligned contact etch. Finally, the method or methods should allow for increased opening depth, especially in process steps requiring the formation of deep openings of different depths, without an unacceptable sacrifice in performance. The method or methods should provide the above described etch characteristics without requiring extensive redesign of the process or process tools, unacceptable performance or process maintenance tradeoffs, costly and unproven equipment, or high particle generation.

SUMMARY OF THE INVENTION

A method of etching openings such as contact openings or via openings in an oxide layer is disclosed. The method of the present invention may be used for a wide variety of etches, including etches with openings having different aspect ratios, over flat structures, over steep topography, and in etches having all of these. In the present invention, the ARDE effect is reduced or eliminated, improved oxide:nitride selectivity is achieved, and tradeoffs between selectivity and other performance goals are greatly reduced or eliminated. In one embodiment, a hard mask layer of, for example, polysilicon is used as a mask for the oxide etch. A patterned photoresist layer, exposing regions of the hard mask corresponding to the openings to be formed in the oxide layer is formed on the hard mask. An etch of the hard mask in the exposed regions is then performed. It has been found that the interaction of the photoresist mask, and more particularly it is believed the carbon from the photoresist mask, with the plasma etch chemistry has a dominant effect on the aspect ratio dependency of the etch. Therefore, in one embodiment, the photoresist mask is removed prior to the completion of the oxide etch. The elimination of the photoresist/etch chemistry interaction has been found to greatly reduce or eliminate aspect ratio dependent etch effects. Additionally, the hard mask is found to interact with the etch chemistry to improve the oxide:nitride selectivity. In another embodiment of the present invention, the oxide etch is carried out at an elevated temperature, allowing for increased selectivity without a tradeoff with wall angle. In a further embodiment, Freon 134a is used as an additive to the etchant gas allowing for improved oxide:nitride selectivity. In a further embodiment, the hard mask, Freon 134a, and elevated temperature are used to perform etches providing a selective oxide :nitride etch over both flat surfaces and corner topography. In additional embodiments, the etches may be carried out in two steps. In the case of a thick oxide layer, this allows for a high etch rate, and selectivity, while leaving a uniform nitride underlayer. In one two step etch process, a clean step is performed to remove any built up polymers before proceeding with the second etch step.

Additional features and benefits of the present invention will become apparent from the detailed description, figures, and claims set forth below.

BRIEF DESCRIPTION OF THE DRAWINGS

The present invention is illustrated by way of example and not limitation in the figures of the accompanying drawings in which like references indicate similar elements and in which.

DETAILED DESCRIPTION

A method of etching an oxide layer using a hard mask is disclosed. In the following description, numerous specific details are set forth such as specific materials, thicknesses, processing steps, process parameters, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. Furthermore, in the following discussion, several embodiments of the present invention are illustrated with respect to specific structures, oxide layers, and oxide layer openings. It will be appreciated that each of the methods described herein can be utilized on a variety of structures and oxide layers, to form any type of opening, and each of the oxide etching methods described herein is not necessarily restricted to the structure and/or oxide layer in conjunction with which is described. Further, any of the methods described herein may be performed as a part of a multistep etch comprising additional etch processes. Several exemplary multistep processes are described below.

Figure 5:
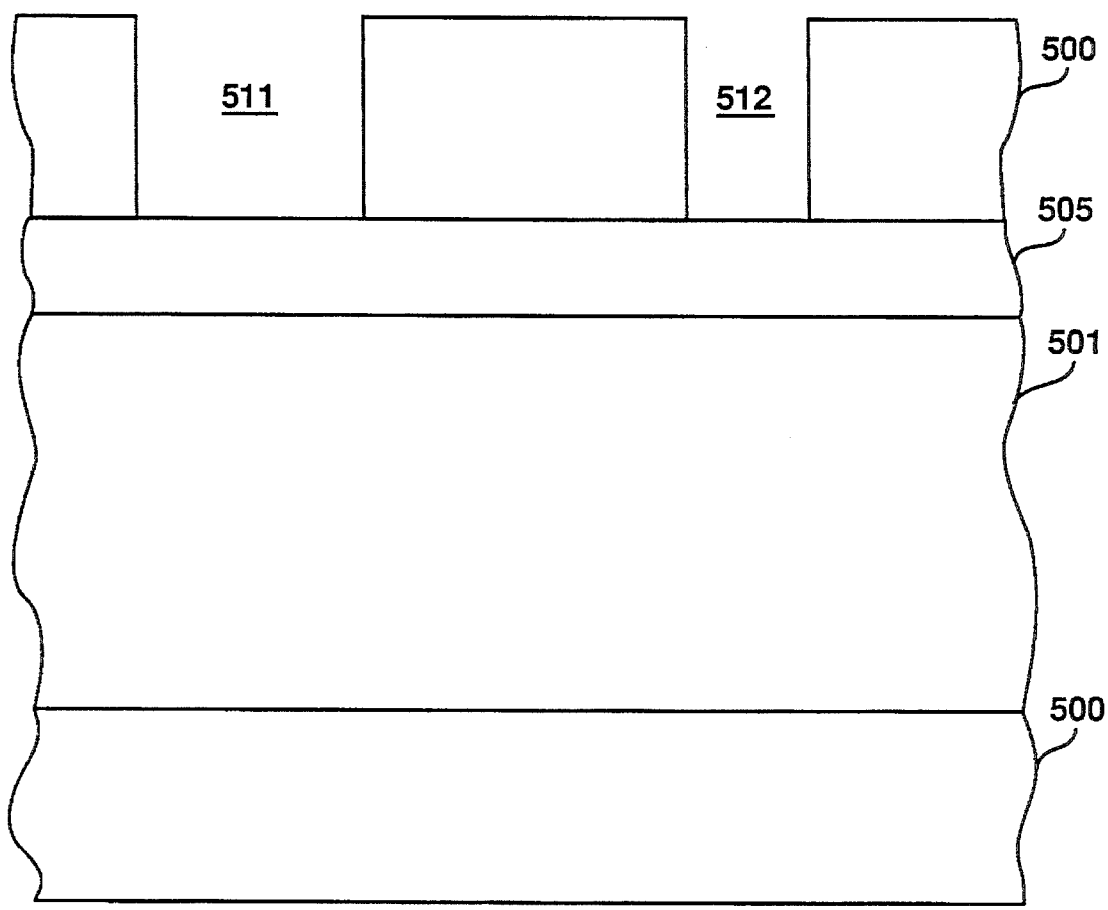
FIG. 5 is a cross-sectional election view of a structure having a hard mask of one embodiment of the present invention.
Figure 6:
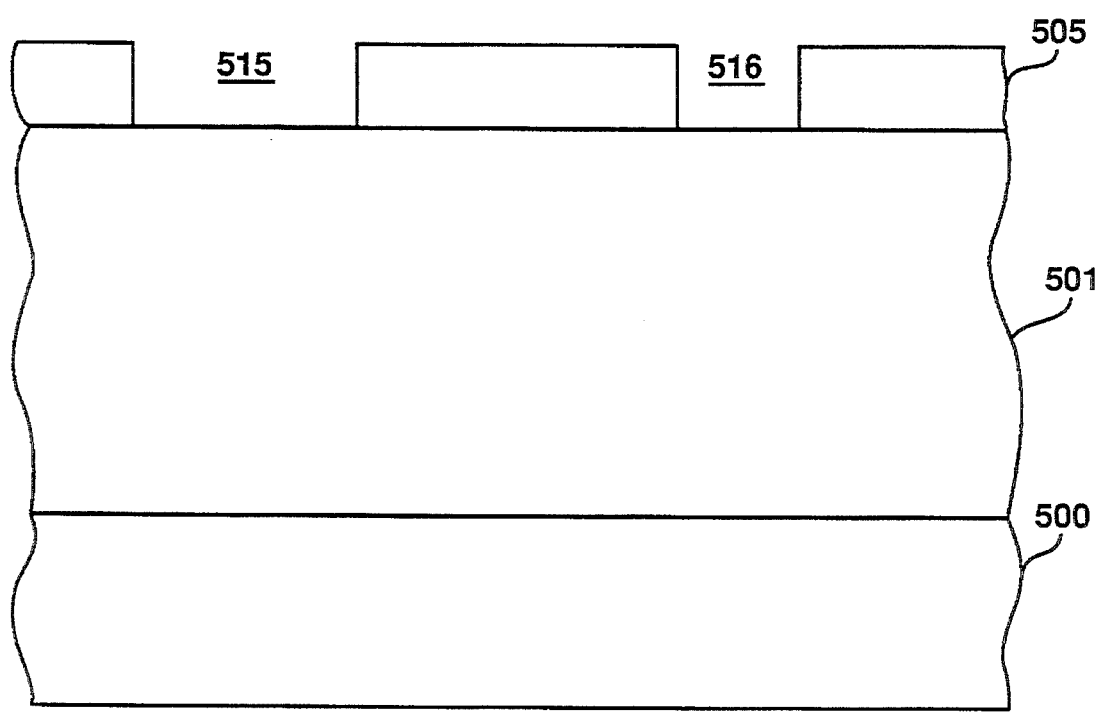
FIG. 6 illustrates the structure of FIG. 5 after the etch of the hard mask.
Figure 7:
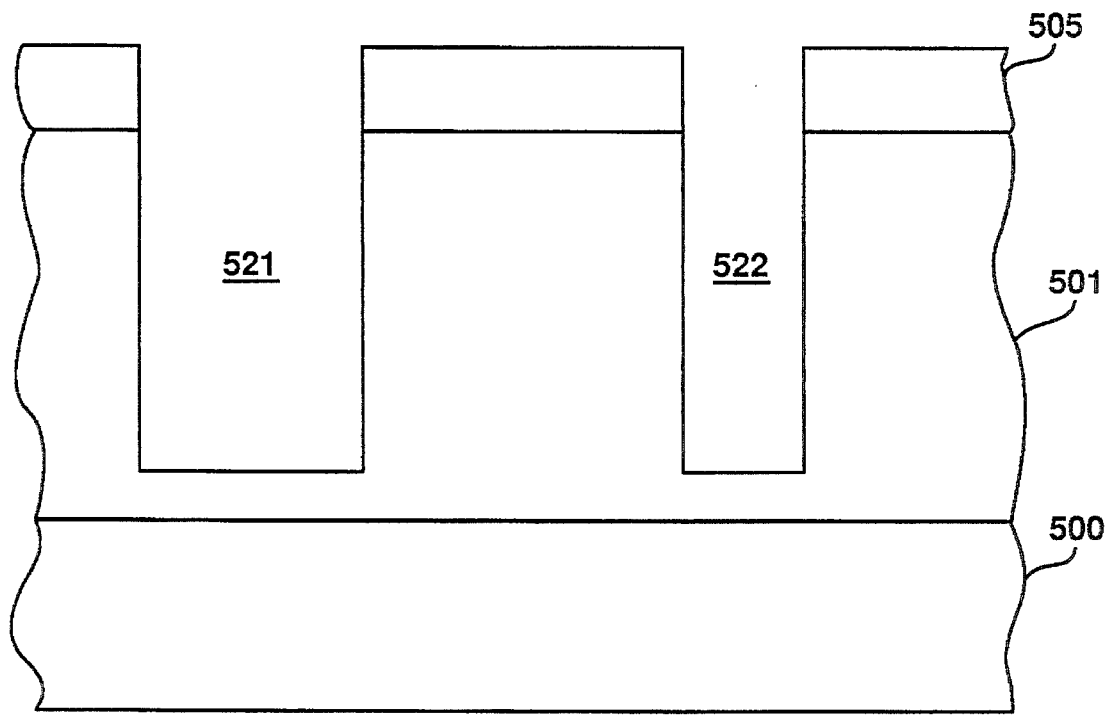
FIG. 7 illustrates the oxide etch performed on the structure of FIG. 6 in an embodiment of the present invention, just prior to completion.
Figure 8:
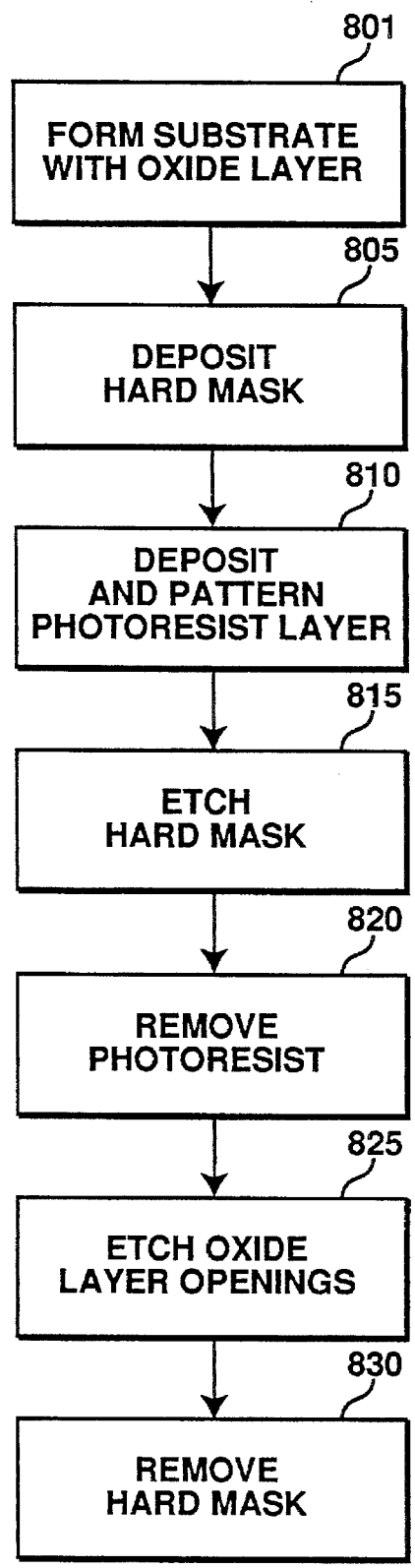
FIG. 8 shows a block diagram of the steps used in the process shown in FIGS. 5–7.

FIGS. 5–7 illustrate a structure during fabrication according to a preferred embodiment of the present invention. FIG. 8 shows a block diagram of the process shown in conjunction with FIGS. 5–7. First, as shown by block 801 of FIG. 8, substrate 500 having oxide layer 501 thereon is formed, as illustrated in FIG. 5. Substrate 500 may comprise a semiconductor substrate including device regions, layers, and structures, and may have varying topography underlying oxide layer 501. Oxide layer 501 may be any type of oxide, doped or undoped, and may be a grown oxide or a deposited oxide deposited by any method such as CVD, sputter deposition, etc. It will be appreciated that oxide layer 501 may be a multilayer structure consisting of several different types of oxide layers. For example, in one embodiment, oxide layer 501 comprises a 10,000 Å BPSG layer, which itself may comprise several sublayers of different dopant concentrations, plus 3000 Å of undoped oxide on top of the BPSG layer. In one embodiment, the oxide layer 501 is disposed on a 900 Å CVD nitride layer comprising the uppermost surface of substrate 500. Then, in step 805 of FIG. 8, a hard mask is formed on the oxide layer. As shown in FIG. 5, hard mask layer 505 is deposited upon oxide layer 501. In a preferred embodiment, hard mask layer 505 comprises polysilicon deposited by, for example, CVD to a thickness in the range of approximately 500–5000 Å. It will be appreciated that hard mask layer 505 can be deposited by any well known method, and that other thicknesses may be used. Additionally, it will be appreciated that other types of layers or combination of layers may be used as the hard mask, such as silicon nitride, aluminum, titanium silicide, tungsten, or other refractory metal, etc. For reasons that will be seen, hard mask layer 505 is preferably a non-carbon or very low carbon contributing film.

In step 810, patterning layer 510 which may be, for example, photoresist, is deposited on hard mask layer 505 and patterned to form openings 511 and 512 using well known methods, as shown in FIG. 5. It will be appreciated that many additional openings across the surface of the wafer may be formed simultaneously with those shown in the Figures. Next, in step 81 5 the hard mask is etched using an etchant appropriate for the material of which hard mask 505 is composed, and patterning layer 510 is removed in step 820. The resulting structure after steps 815 and 820 is shown in FIG. 6 wherein openings 515 and 516 have been formed in hard mask layer 505. Note that the diameter of opening 515 is significantly greater than that of opening 516, so that opening 516 has a much higher aspect ratio. As described earlier, this typically leads to a much slower oxide etch rate in the region of opening 516. However, with use of the hard mask 505 this is avoided in the present invention. The structure of FIG. 6 is next subjected to an oxide etch in step 805 to form openings in the oxide layer corresponding to hard mask openings 515 and 516. Referring to FIG. 7, openings 521 and 522 in the oxide layer 501 during the etch, at a time just prior to completion of the etch, are shown. As can be seen, the openings 521 and 522 extend approximately the same distance through the oxide layer 501. Thus, by use of the hard mask, the ARDE effect is greatly reduced or eliminated. As mentioned above, substrate 500 may have varying topography, so that the openings through oxide layer 501 extend to varying depths. Therefore, in such a case, even if all openings have the same diameter, there will be varying aspect ratios across the wafer due to the different depths. Additionally there may be both varying depths and varying diameters of openings. In all of these cases, the hard mask of the present invention has been found to reduce or eliminate the aspect ratio dependency of the etch.

Although the use of hard mask 505 is advantageous in any etch process, one embodiment of the present invention is carried out in the LAM 384T Dry Etch System which is an RIE/Triode system. For 6" (150 mm) wafers, the etch is carried out in a flow comprising 2.5 standard cubic centimeters per minute (SCCM) Freon 134a and 10 SCCM $CHF_3$ (Freon 23). The etch is carried out at 600 watts (W) with a DC bias of approximately 1400 volts (V). The etch is performed at a pressure in the range of approximately 10–40 mTorr. The lower electrode water coolant temperature is set at 17° C., and the upper chamber temperature is set at 50° C. It will be appreciated that although the above described etch was performed in a single step after removal of the photoresist layer 510, the etch may be carried out in two steps, with a first portion of the oxide layer etched with resist layer 510 intact, followed by resist strip, and then a high performance final etch step with just the hard mask remaining to define the openings. For example, in one embodiment a high etch rate, non-selective etch step designed to etch the undoped oxide layer and some of the doped layer, such that there remains approximately 2000 Å of oxide in the thinnest area of the wafer, is first performed, followed by a second etch step similar to that described above. As will be described in a further embodiment of the present invention, a clean step may be performed between the etch steps.

The use of hard mask 505 as described above is beneficial in any existing oxide etch process. The invention is believed to provide for minimized ARDE effect by eliminating the photoresist contribution to the total carbon content of the plasma. As described earlier, polymer residue formed from carbon in the plasma has a strong effect on etch characteristics such as selectivity and wall profile. However, it is heretofore not been recognized that the photoresist layer has such a dominant effect on etch characteristics such as the ARDE effect. Because this dominant effect from the photoresist is removed, considerable process latitude is achieved, since the selection of the etch gas chemistry is no longer constrained by the requirement that it be adjusted to minimize the ARDE effect, and can instead be adjusted to achieve other performance goals such as etch rate, selectivity, profile control, etc. As described above, the benefits of the present invention are believed to be achieved by eliminating the interaction of the photoresist, and most likely the carbon from the photoresist, with the plasma chemistry. Therefore, in alternative embodiments of the present invention, a photosensitive layer which has been treated to become relatively inert to the plasma chemistry may be used as the sole masking layer. For example, a silylated photoresist layer, formed by, for example, a process known as the "DESIRE" process may be used. In this process, the exposed resist layer is treated with HMDS or a similar compound to impregnate portions of the layer with silicon. See, for example, Pavelchek et al., "Process Techniques For Improving Performance of Positive Tone Silylation" SPIE vol. 1925, pp 264–269, January 1993; and, C. A. Spence, S. A. MacDonald, and H. Schlosser, "Silylation Of Poly (t-BOC) Styrene Resists: Performance And Mechanisms," U. C. Berkeley and IBM Almaden Research Centre. See also, references cited in these papers. A photosensitive layer treated in this or a similar manner, which does not significantly react with the etch chemistry, and therefore does not overwhelm the carbon content of the plasma, may be used in place of the hard mask layer described herein. In this case, there is no need for both a patterning layer and a hard mask layer as described above. By inclusion of hard mask 505, or by making the photosensitive layer substantially inert to the plasma chemistry, an existing oxide etch process need not be reengineered, performed on new equipment, etc., and many of the tradeoffs associated therewith can be avoided or minimized. In the present invention, the etch can be tailored without the problem of carbon from the photoresist overwhelming the etch characteristics. As will be seen, embodiments of the present invention further include methods of minimizing the selectivity/wall angle tradeoff, improved oxide:nitride selectivity, improved selectivity in etches requiring openings to extend over corners, and methods of etching deep openings in the oxide layer. The methods of the present invention may be used to achieve the various performance goals as described generally herein, and may be used to improve process latitude.

As is well known, in the prior art methods of etching an oxide layer, considerable heat is generated by collisions of the ions and/or electrons in the plasma with the substrate. As is known, the amount of energy generated in this way will be dependent upon the various process parameters such as the gas used, power, etc. To prevent extreme temperature rises, the wafer temperature is controlled by a flow of a coolant such as water through the lower electrode, and/or by a flow of, for example, helium gas to the backside of the wafer. In typical processes, the cooling is carried out such that the wafer reaches a maximum temperature in the range of approximately 60°–80° C. In any event, the upper temperature limit is constrained by the use of a photoresist patterning layer, since the wafer must be cooled sufficiently to prevent the resist temperature from exceeding the resist reticulation temperature, at which point the resist layer deforms, leading to loss of dimensional control, and potential openings in areas which are designed to remain unetched. Typical resists have a reticulation temperature of approximately 110° C. However, note that in the present invention, as shown in FIG. 6, the resist layer may be removed prior to performing the oxide etch. Therefore, in a further embodiment of the present invention the temperature is adjusted (by appropriate adjustment of the backside coolant flow) above the resist reticulation temperature if desired. For example, in one embodiment performed in the above described etch system, the backside helium pressure is reduced to approximately 2 Torr, which typically results in a helium flow of approximately 1–5 SCCM, as compared with approximately 8 Torr, which typically results in the helium flow of approximately 5–15 SCCM, for a similar process using a resist mask. By adjusting the helium pressure as described above, the wafer temperature can be expected to reach temperatures of approximately 100°–200° C. or higher. In a preferred embodiment, the wafer temperature is maintained at approximately 110°–130° C. Note that this temperature range is above the resist reticulation temperature described above.

Figure 1:
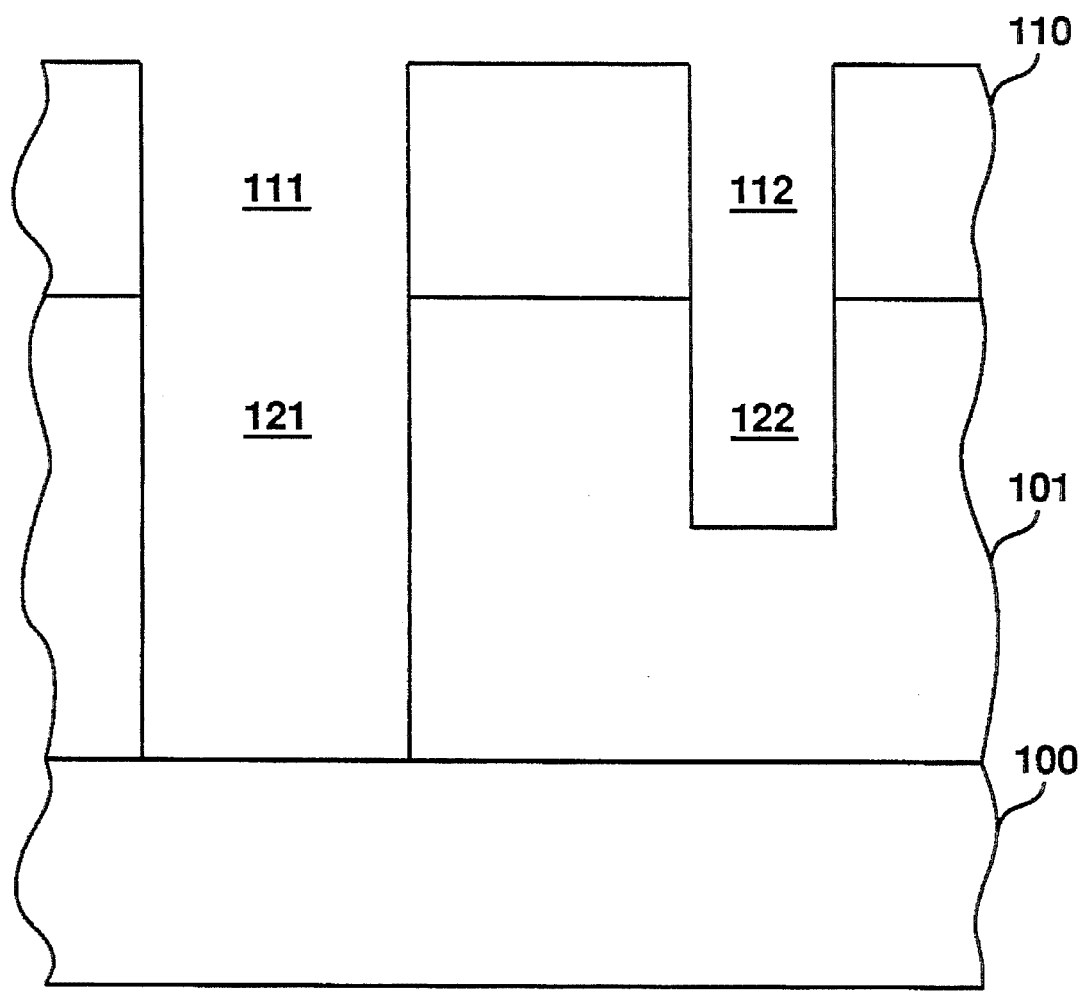
FIG. 1 illustrates aspect ratio dependent etching of a prior art oxide etch process.
Figure 2:
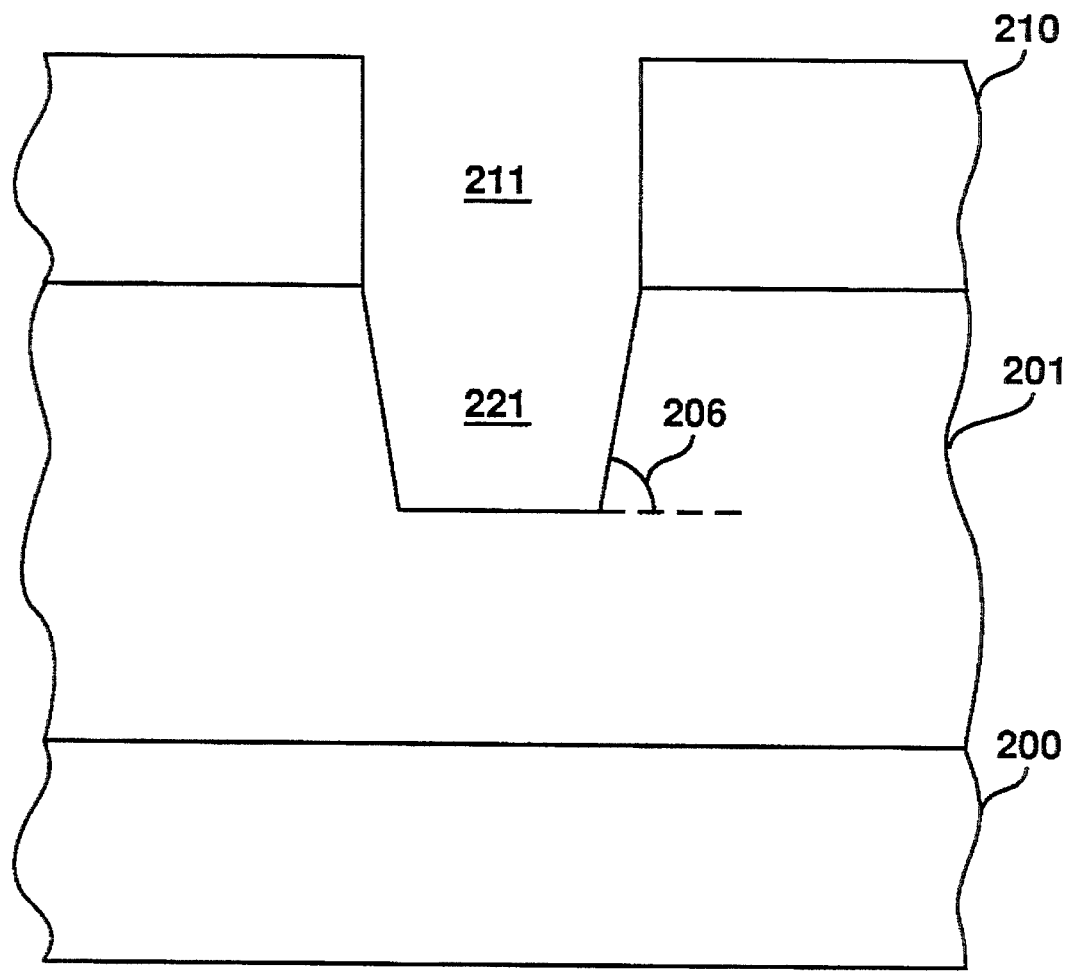
FIG. 2 illustrates wall profile in a prior art oxide etch process.
Figure 3:
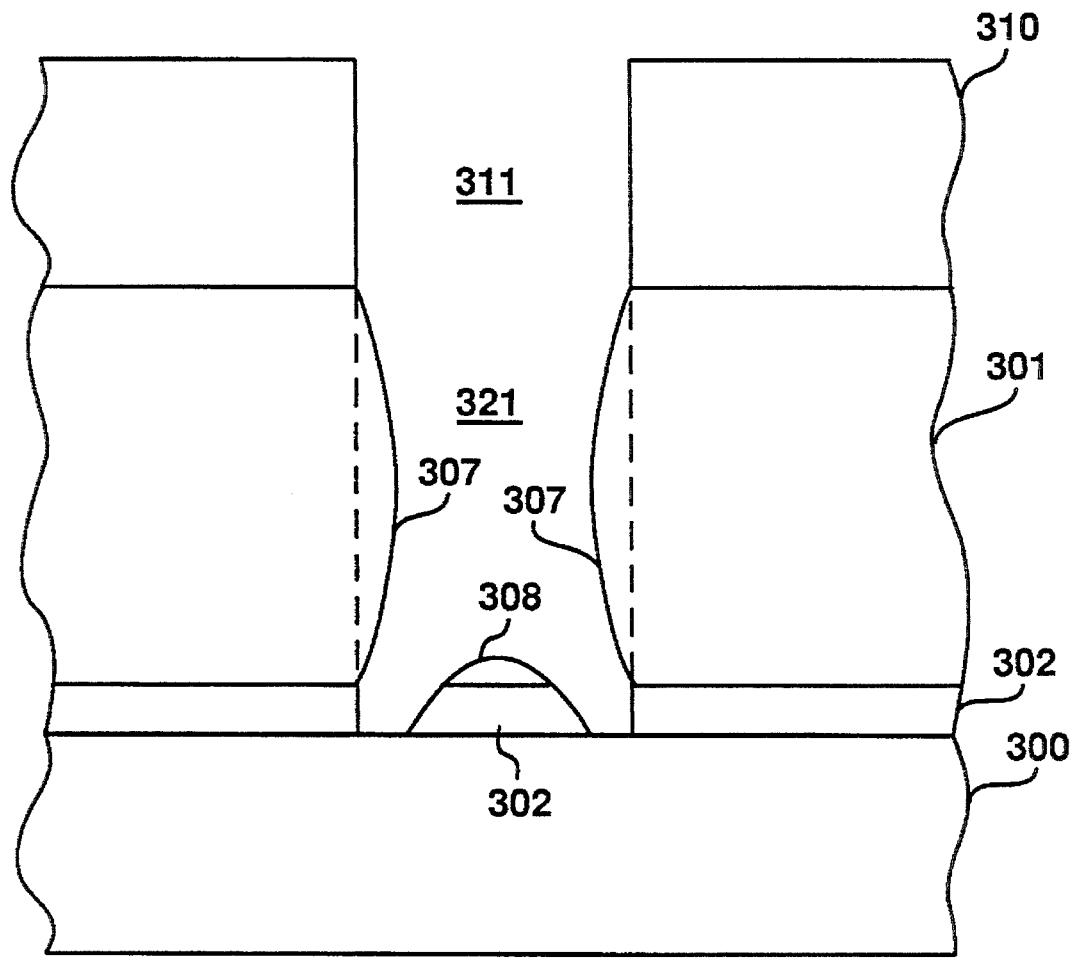
FIG. 3 illustrates poor oxide :nitride selectivity in a prior art etch-process.
Figure 9:
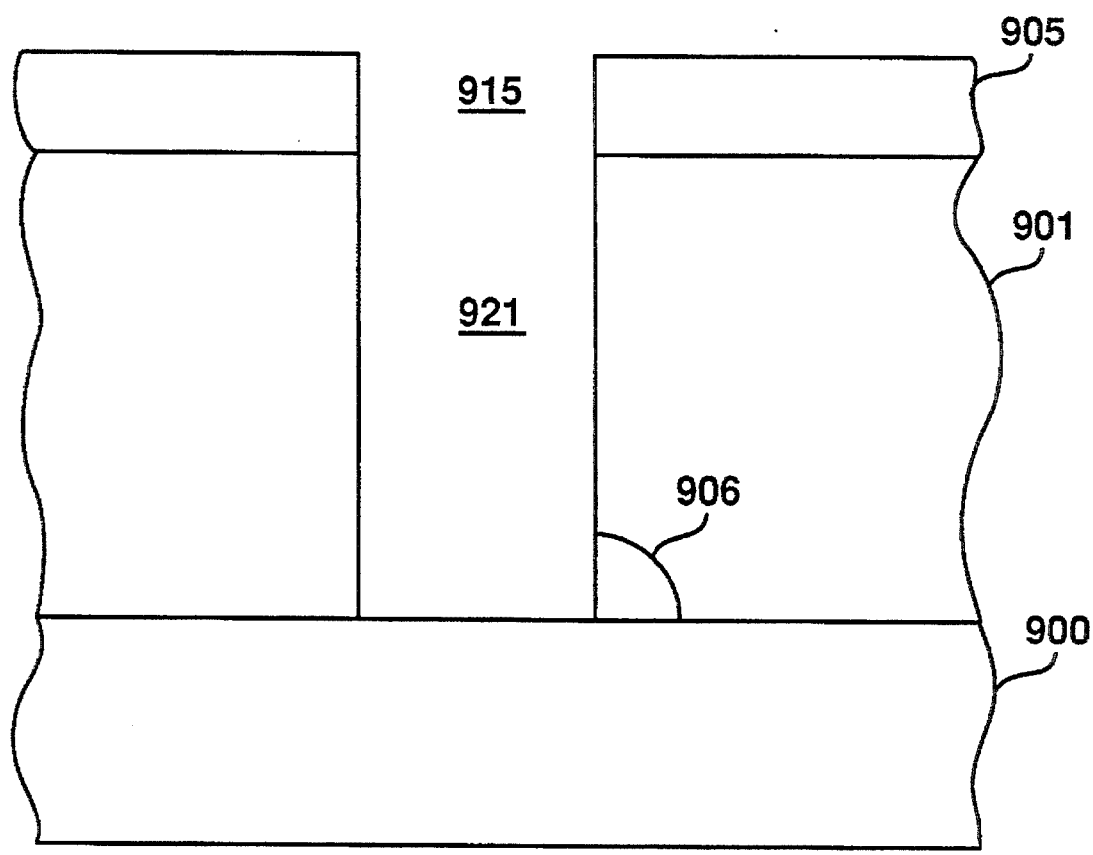
FIG. 9 illustrates the result of an oxide etch in accordance with an embodiment of the present invention.

FIG. 9 shows an example of opening 921 formed in oxide layer 901, which may be any type of oxide layer, using hard mask 905, which is generally similar to hard mask 505. The substrate 900 is generally similar to substrate 500, and may comprise many layers, structures, and may have topography underlying the openings to be formed. As before, a plurality of openings may be formed having different diameters and/or different aspect ratios. The etch is performed with the above described helium flow and pressure. In one embodiment the etch is performed in a flow comprising approximately 1.5 SCCM Freon 134a and approximately 47 SCCM $CHF_3$. The etch is carried out at a power of 600 W, a pressure of 30 mTorr, and a DC bias of approximately 1400 V. The lower electrode water coolant temperature is set at approximately 17° C. and the upper chamber temperature is 50° C. The angle 906 using the increased temperature is greater than 85°. This is in contrast to the angle 206 of FIG. 2. It is believed that the elevated temperature improves the wall angle by preferentially inhibiting polymer formation on the oxide sidewall as compared with the bottom of the opening. In some cases this provides a steep wall angle and an increase in selectivity. It has been found that the profile control is maintained even through layers of different types of oxide, such as doped and undoped, as well as various doping levels. In general, it is believed that the increased temperature causes all types of oxides to be less "sticky" than other layers, particularly nitride, so that high etch selectivity of oxide to silicon, silicon nitride, titanium silicide, etc. may be achieved. Further, the use of a higher temperature to improve wall profile without selectivity tradeoff is applicable to any process using any chemistry. Because the selectivity is improved or remains the same, at the higher temperature a greater process latitude results. For example, selective etches of relatively thick layers of BPSG, with good profile control may be achieved. Furthermore, the temperature increase generally increases the etch rate, so that throughput is higher. In addition to this improved wall angle, the embodiment illustrated in FIG. 9 also achieves the earlier described advantages of the hard mask layer.

Figure 10A:
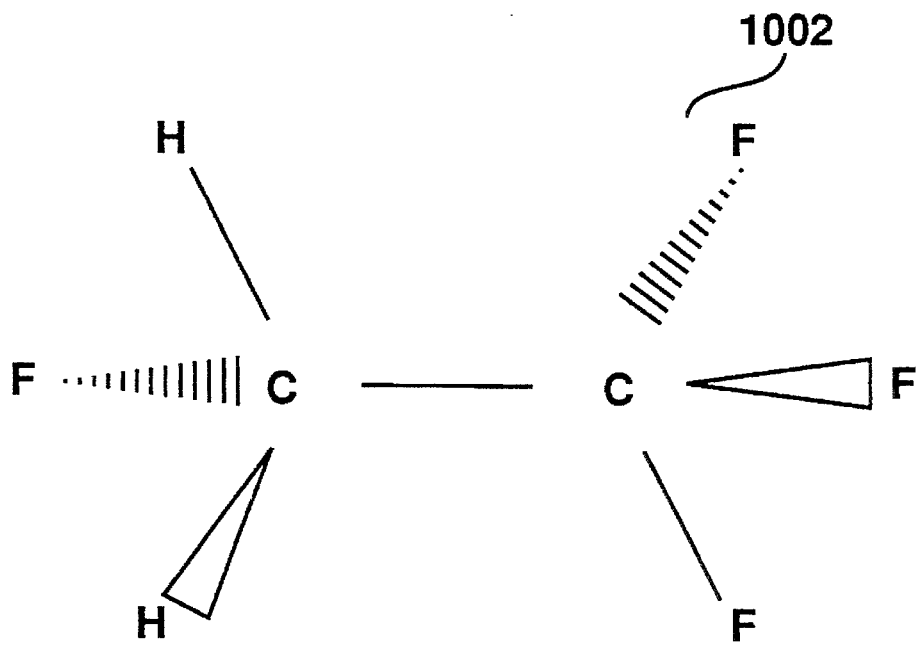
FIG. 10A illustrates the molecular structure of an etchant used in an embodiment of the present invention.
Figure 10B:
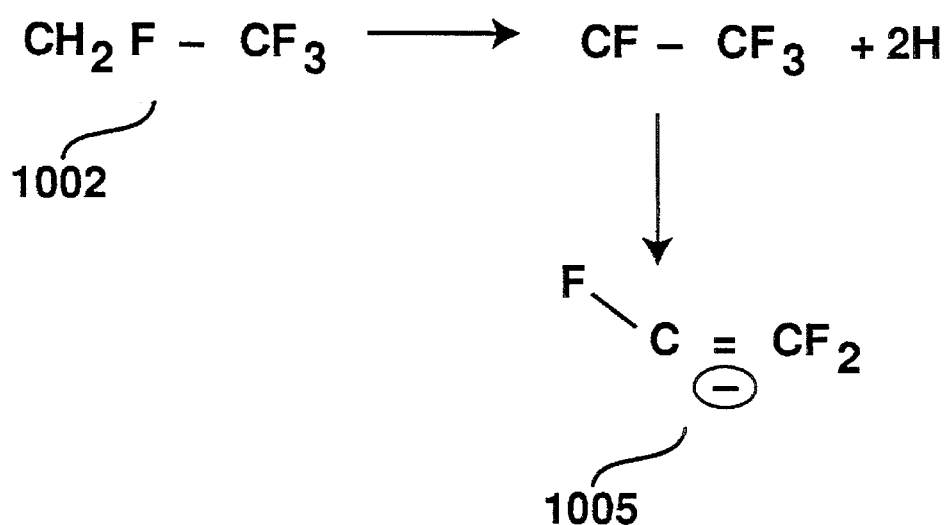
FIG. 10B illustrates a proposed reaction of the molecule of FIG. 10A.
Figure 11:
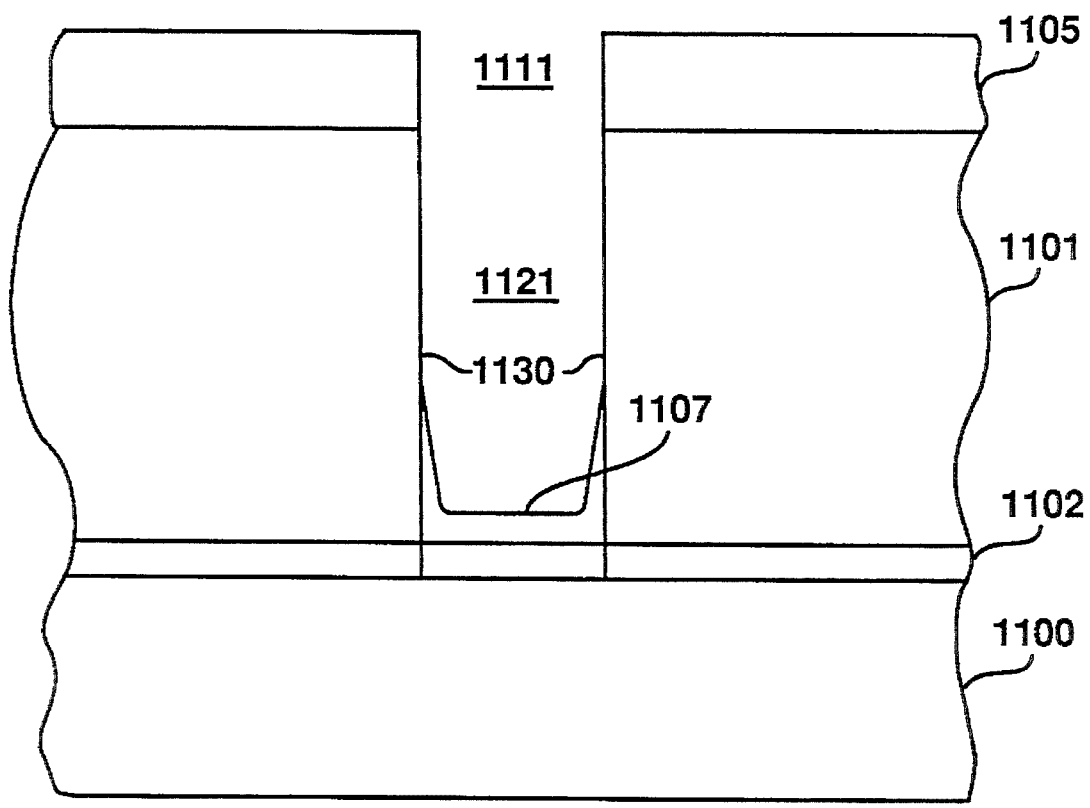
FIG. 11 shows the result of an oxide etch using a chemistry comprising the etchant shown in FIG. 10.

In the present invention it has been found that by the addition of Freon 134a to any etch chemistry, improved oxide:nitride selectivity is achieved, even in chemistries that do not otherwise exhibit oxide:nitride selectivity. Freon 134a has the formula $C_2H_2F_4$. An illustration of the Freon 134a molecule 1002 is shown in FIG. 10A. In a currently preferred embodiment, the etch is performed in a mixture comprising Freon 134a, and Freon 23 ($CHF_3$). In one embodiment, the etch is performed with a Freon 134a flow rate of approximately 1.5 SCCM, a $CHF_3$ flow rate of approximately 47 SCCM, a pressure in the range of approximately 10–40 mTorr, a power of approximately 400–1200 W, and a DC bias in the range of approximately 1000–2000 V. Referring to FIG. 11, oxide layer 1101 overlying nitride layer 1103 on substrate 1100 is shown. Substrate 1100 is generally similar to the substrates described previously, and oxide layer 1101 is generally similar to oxide layer 501. Hard mask layer 1105 has been patterned and etched to form an opening 1111 therein. An etch is performed as described above, and opening 1121 is shown during the etch process. As can be seen, the oxide sidewalls 1121a have minimal polymer deposition, while the bottom 1121b has some polymer buildup. Although the precise mechanism is not known, it is believed that the Freon 134a of the present invention allows for such improved selectivity by working in combination with the polysilicon hard mask to reduce free fluorine (F) neutrals and ions, to reduce their concentration in the plasma, thus decreasing the F/C ratio at nitride surfaces as compared to oxide surfaces. This brings the etch into the regime where oxide etching is still at an acceptable rate, while little etching occurs on the nitride. It is further believed that the increased selectivity may result from the presence of a three carbon chain molecule formed by reaction with Freon 134a molecule 1002 with carbon from another source. It is believed that the Freon 134a undergoes the reaction shown in FIG. 10B to create the stabilized molecule 1005. The molecule 1005 may then undergo a reaction with, for example, $CHF_3$ to form the above mentioned three carbon molecule. The improved selectivity has been found using Freon 134a together with, for example, $CHF_3$. However, it has been found that mixtures of $CHF_3$ and $CH_2F_2$ (Freon 32), mixtures of $CHF_3$ and $CHF_2CF_3$ (Freon 125), and mixtures of $CHF_3$ and $C_2F_6$ (Freon 116) do not exhibit the improved selectivity of Freon 134a, so that it appears the second hydrogen atom on the first carbon atom may be important to the proposed mechanism.

The improved selectivity of the present invention additionally is believed to be achieved in part by the F gettering action of the hard mask, the hard mask 1105 is preferably polysilicon, or some other F reactive film such as silicon nitride, tungsten (W), titanium silicide (TiSi), etc. Of course, as with hard mask 505, hard mask 1105 is additionally preferably a non-carbon or very low carbon content film. The addition of Freon 134a has been found to work on a wide variety of different feature sizes, can be employed in a variety of processes and etch tools. Further, the improved selectivity can be achieved with minimal or no tradeoff with other performance goals. Additionally, the selectivity provided by the present invention can be achieved without resort to processes having unstable plasma conditions and without resort to high polymer chemistries, thus avoiding the problems of difficult reactor maintenance, particle generation, and reduced wall profile control. For an existing etch process chemistry, varying amounts of Freon 134a may be added, depending upon the particular situation. For example, typically, Freon 134a may be added such that the Freon 134a flow is in the range of approximately 3–50% of the total flow.

It will be appreciated that in many prior art processes with high selectivity, in addition to the wall profile control problem, it is often difficult to completely etch the oxide layer especially in deep openings. However in the present invention, since the carbon contribution from the photoresist is removed, the selectivity is achieved without the problem of excessive polymer buildup in the bottom, so that openings may be etched to completion. Additionally, in the present invention, it has been found that due to the sticking of polymer to nitride, nearly infinite selectivity to nitride is achieved. That is, after a small initial amount is etched, polymer buildup begins so that regardless of the length of the etch, nitride etching does not continue after the small initial amount is etched.

Figure 4:
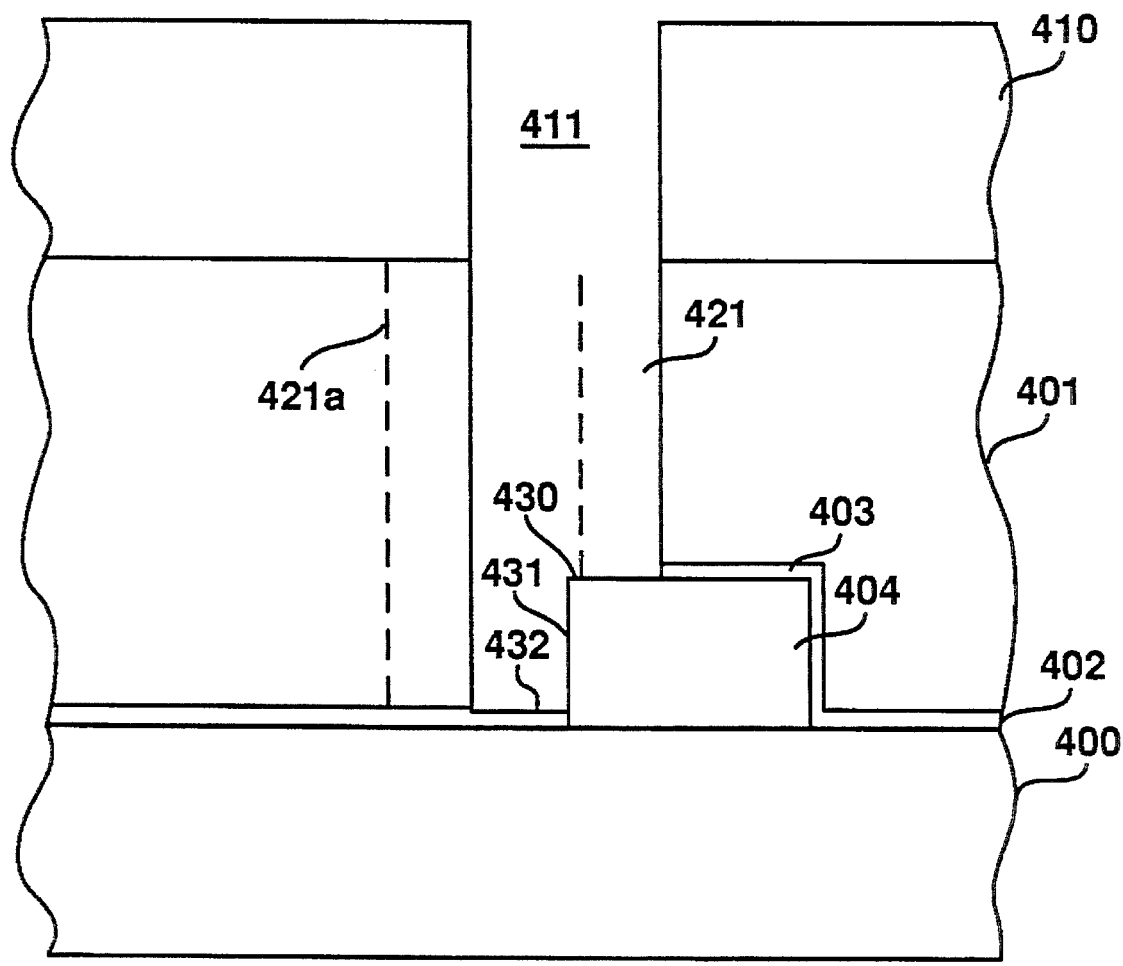
FIGS. 4 illustrates a prior art etch process over a structure.
Figure 12:
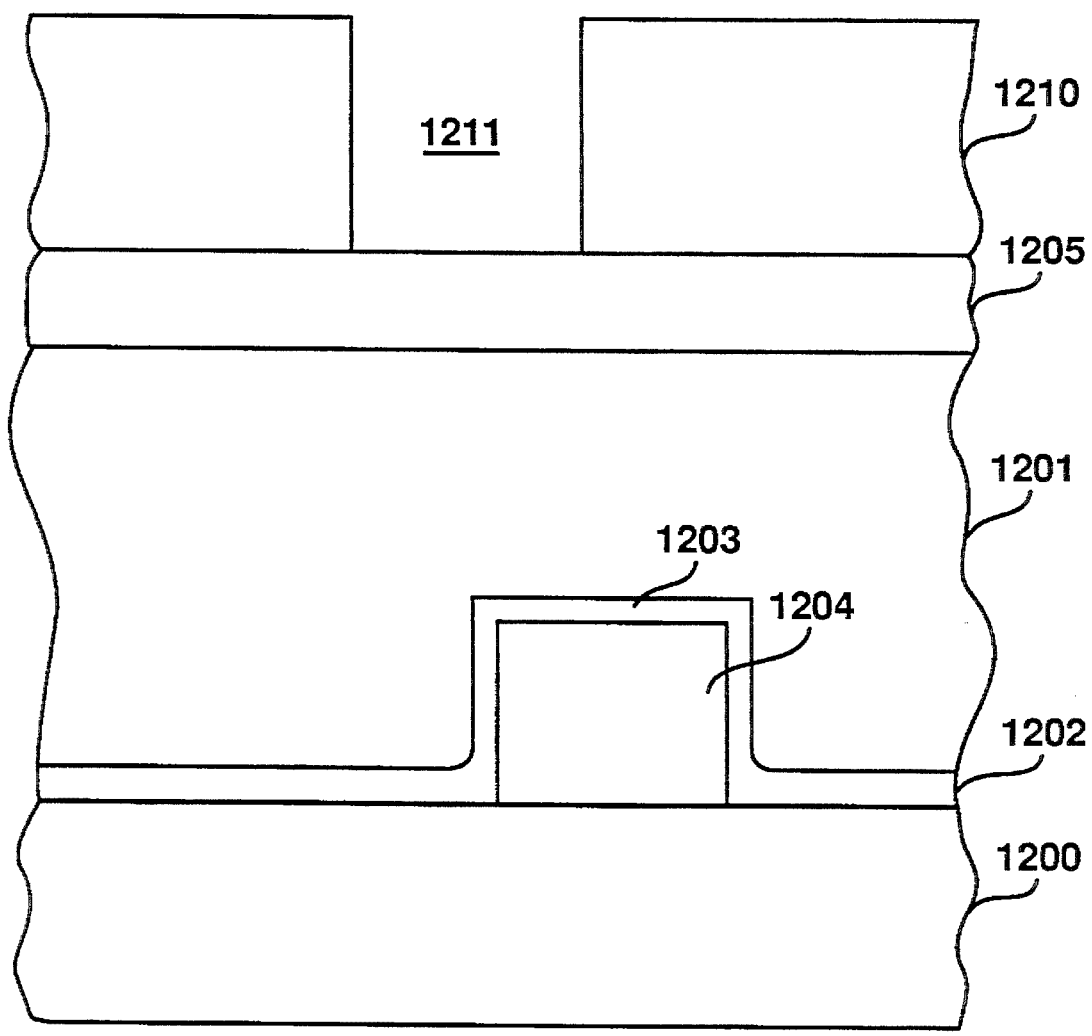
FIG. 12 illustrates a cross-sectional elevation view of a structure on which an oxide etch according to an embodiment of the present invention is to be performed.
Figure 13:
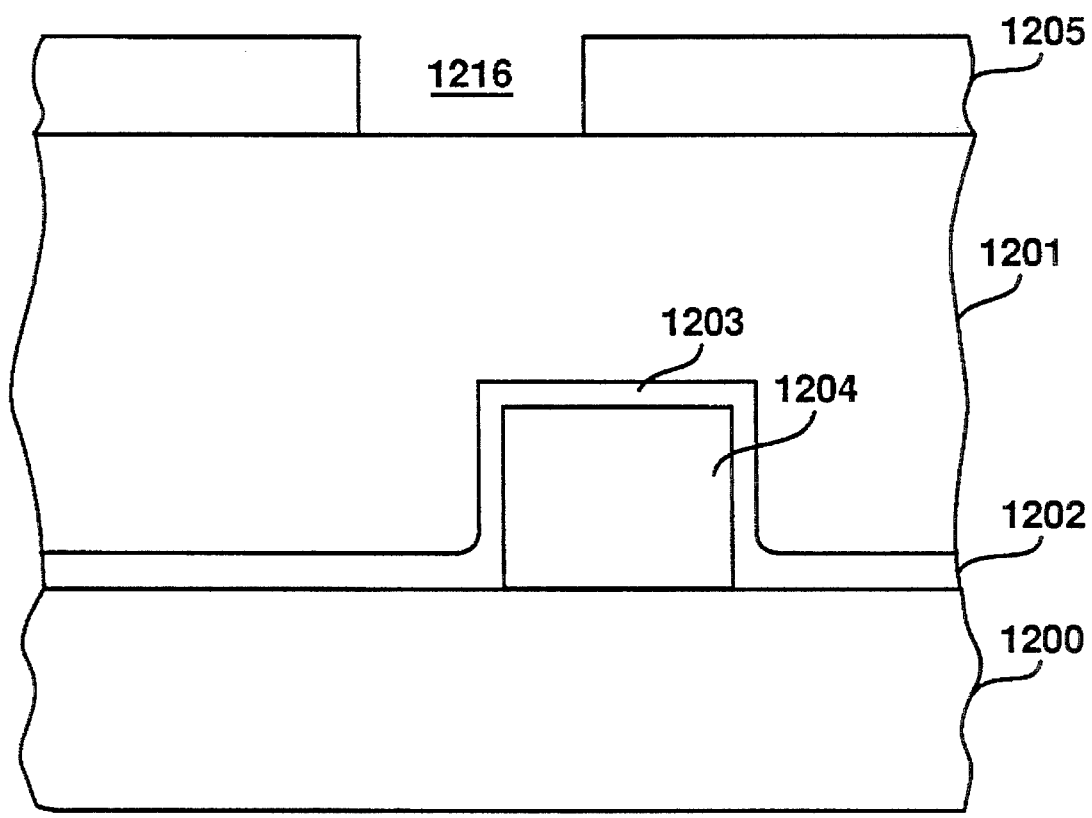
FIG. 13 illustrates the structure of FIG. 12 after etching of the hard mask of an embodiment of the present invention.
Figure 14:
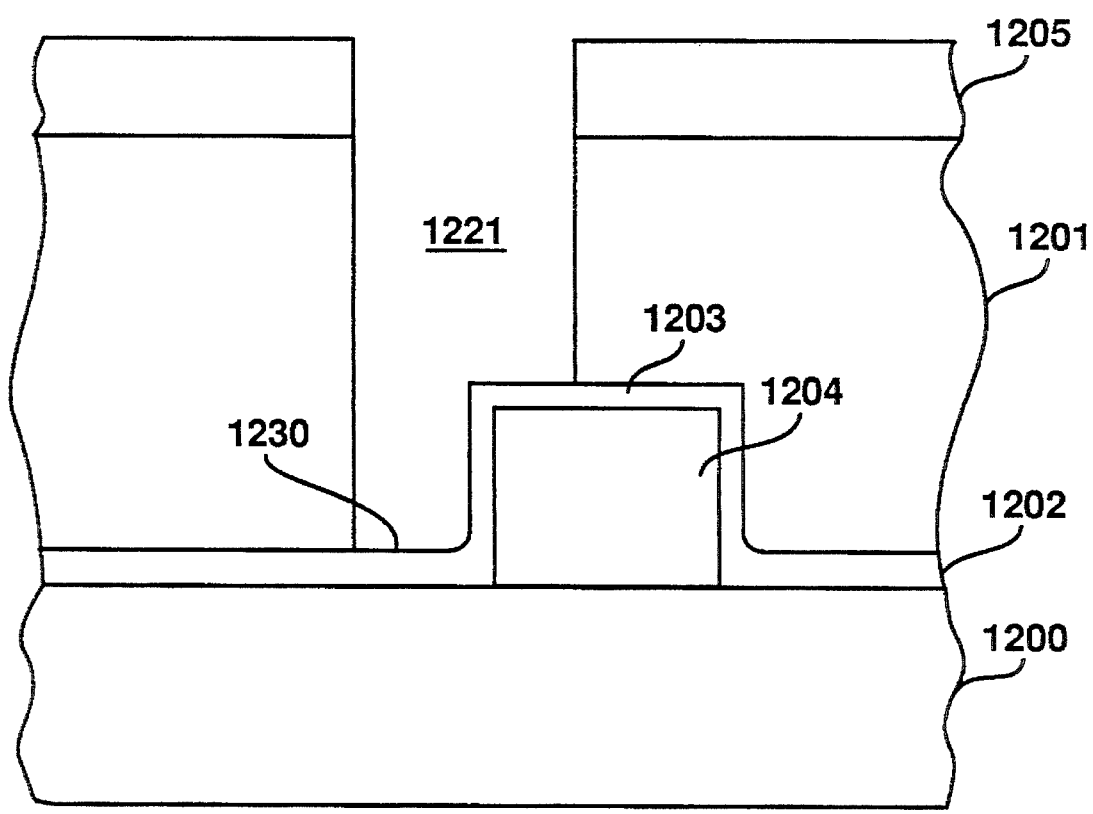
FIG. 14 illustrates the structure of FIG. 13 after an oxide etch according to an embodiment of the present invention.

As discussed in relation to FIG. 4, in addition to the difficulty in achieving oxide:nitride selectivity, it is further difficult to achieve nitride uniformity within the bottom of the contact and to avoid removing the nitride etch stop layer from the structure 404. FIGS. 12–14 illustrate a further embodiment of the present invention overcoming this problem. Referring to FIG. 12, hard mask layer 1205 is formed on oxide layer 1201. In one embodiment, oxide layer 1201 comprises a 2000 Å undoped TEOS layer on top of a 12000 Å BPSG layer. The hard mask 1205 is preferably polysilicon or another F gettering material as described in relation to hard mask 1105. Photoresist layer 1210 has opening layer 1211 which is aligned to form an opening in the oxide which will partially overlie the structure 1204, i.e., the etch must extend over a corner. For example, the process step illustrated in FIG. 12 may be a self-aligned contact etch. Referring now to FIG. 13, hard mask 1205 is etched in the region exposed by opening 1211, to form opening 1216. After forming opening 1216, photoresist layer 1210 is removed. In a currently preferred embodiment, an oxide etch is performed through hard mask 1205, utilizing a gas chemistry comprising Freon 134a at high temperature. In a currently preferred embodiment, the etch is performed in a flow comprising 10 SCCM CHF3 and 2.5 SCCM Freon 134a, at a power of 600 W. The backside helium pressure is 2 Torr. As described previously, the use of Freon 134a together with the hard mask 1205 increases the oxide :nitride selectivity. The use of increased wafer temperature provides good wall profile control and provides further improvement in the oxide :nitride selectivity, leading to good nitride layer uniformity on both horizontal and vertical surfaces. Hard mask 1205, in addition to improving selectivity also provides reduced ARDE effects. As can be seen, opening 1221 is formed in oxide layer 1201, while a uniform portion of nitride layer 1203 remains on structure 1204 and a uniform portion of nitride layer 1202 remains on the bottom portion 1230 of the opening 1221. It will be appreciated that the nitride layers 1202 and 1203 may or may not be formed in the same processing step. In one embodiment, nitride layer 1202 and 1203 have a thickness of approximately 700 Å. With the above described etch characteristics, the present invention provides improved results for structures such as that shown in FIGS. 12–14. Because the present invention achieves the high oxide:nitride selectivity described above, the problems described in relation to FIG. 4, over a corner of a structure, do not occur. Additionally, since nitride uniformity is maintained over both corners and flat surfaces, the present invention can be used to perform an oxide etch wherein there are openings that overlie corners and openings that overlie flat surfaces. Additionally, since hard mask 1205 minimizes the ARDE effect, the openings may have different aspect ratios from one another. Note that these results are achieved with existing reactor technology, and without requiring substantial reengineering of the etch process. The present invention provides for an improved process window for an etch over topography and flat surfaces, and of course provides greater process latitude in any type of etch.

Figure 15:
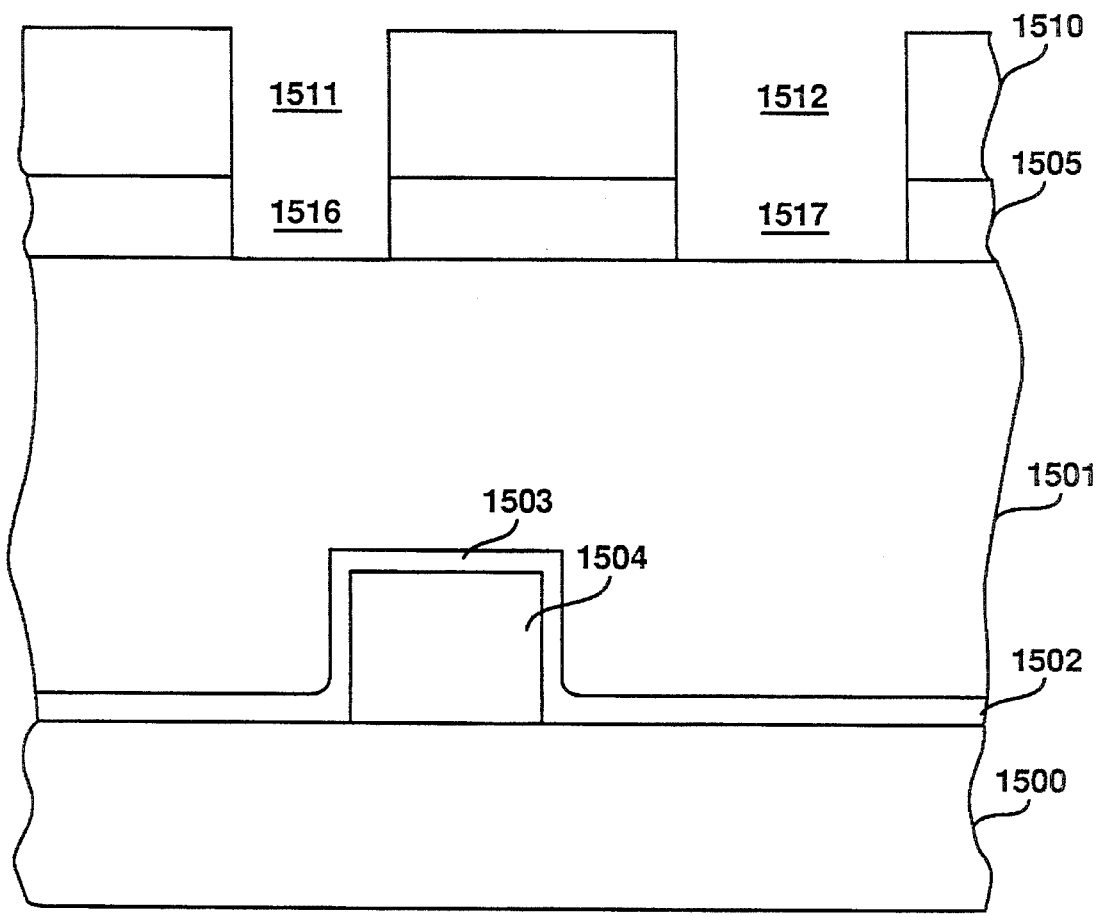
FIG. 15 illustrates a cross-sectional elevation view of a structure to be etched in an embodiment of the present invention.
Figure 16:
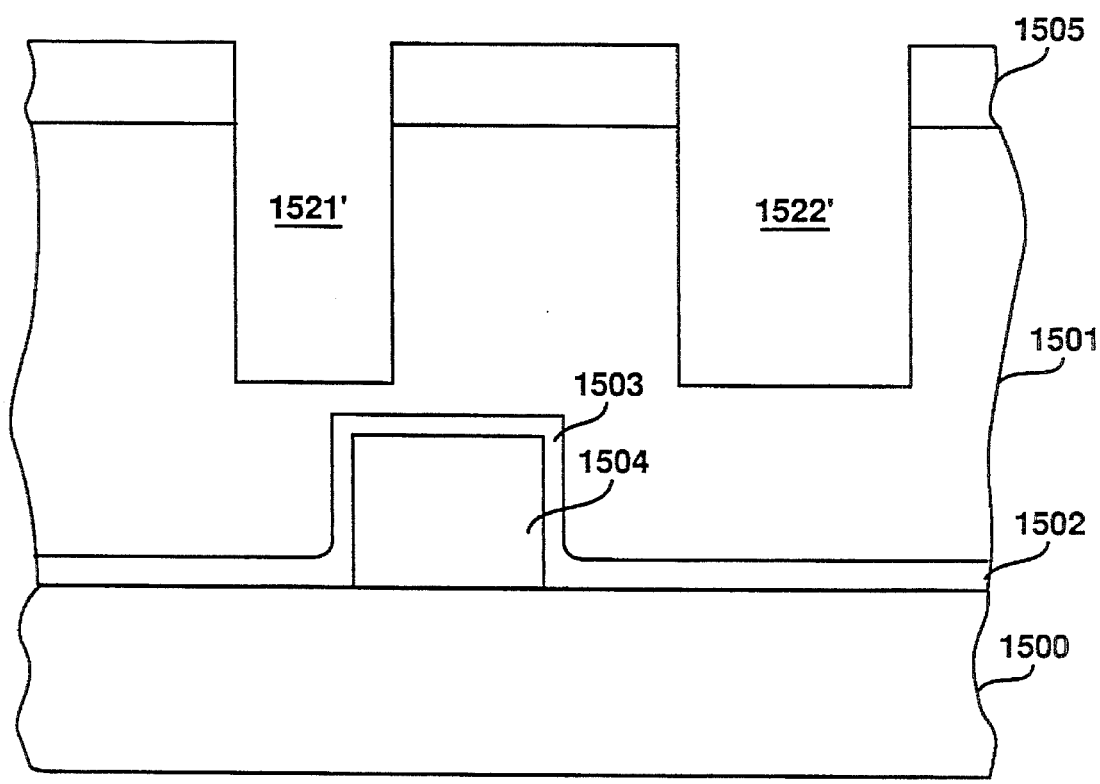
FIG. 16 shows the structure of FIG. 15 after a first etch step and a clean step.
Figure 17:
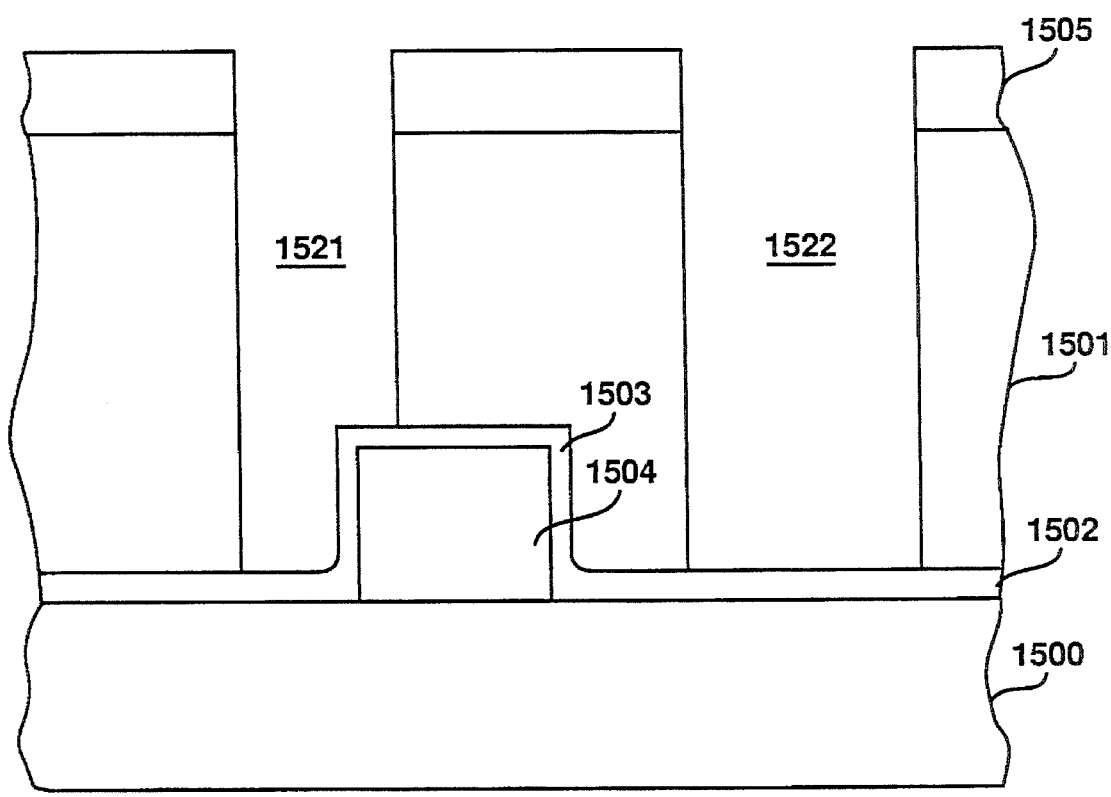
FIG. 17 illustrates the structure of FIG. 16 after a second etch step.

A further embodiment of the present invention allows for increased etch depth to be achieved without sacrificing etch performance. Referring to FIG. 15, patterning layer 1510 having openings 1511 and 1512 is formed on hard mask layer 1505 which has been deposited on oxide layer 1501. Oxide layer 1501 may be a relatively thick oxide having a depth in the range approximately 5,000–30,000 Å. Oxide layer 1501 may comprise several layers of one or more different types of oxide layers. For example, in one embodiment oxide layer 1501 may comprise an uppermost CVD TEOS oxide layer of approximately 3,000 Å, overlying one or more BPSG layers with a total thickness of approximately 10,000 Å–20,000 Å. Typically, it is difficult to etch through such a thick layer completely due to polymer buildup in the bottom of the forming opening. Further, for the reasons described previously, it is difficult to maintain the etch wherein the openings have different aspect ratios, and wherein some openings may be overlying structures. Therefore, in a further embodiment of the present invention, an etch is performed through hard mask layer 1505 to form openings 1516 and 1517 shown in FIG. 15. Next, with resist layer 1510 in place, a high etch rate oxide etch is performed which is preferably designed to etch one or more layers of the uppermost portion of oxide layer 1501. For example, in one embodiment the etch is tailored to etch the undoped layer and some of the doped layer. In one embodiment the etch is performed in a flow comprising 70 SCCM $CHF_3$ and 20 SCCM $C_2F_6$ (Freon 116). The etch is performed at a power of 600 W, and a pressure of 50 mTorr. A helium coolant pressure of 8 Torr is used, and the lower electrode water coolant temperature is set a 17° C. Next, a polymer removal step is performed. The polymer may be ashed in an oxygen plasma, for example, or a wet chemical etch may be performed. For example, in one embodiment a first clean step in an IPC barrel ash system, performed in a flow of oxygen ($O_2$) at 1.5 Torr, 400 W for 45 minutes is performed followed by a clean in a solution of $H_2SO_4 \cdot H_2O_2$ at 150° C. for 20 minutes. It will be appreciated that if desired, the polymer clean may be performed using a single step, similar to one of the above described steps. Additionally, it will be appreciated that many similar clean steps may be performed. During the polymer removal step, the patterning layer 1510 is also removed. FIG. 16 shows the structure of FIG. 15 after these steps have been performed, and partial openings 1521' and 1522' have been formed. As can be seen, a substantial thickness of oxide layer 1501 has been removed. Additionally, all polymer has been removed from the openings. Next, one of the above described etches of the present invention, such as that described in conjunction with FIGS. 12–14, comprising Freon 134a, and at high temperature is performed. The structure of FIG. 16 after the second etch step is shown in FIG. 17. As shown, openings 1521 and 1522 extend all the way through oxide layer 1501 to the surface of nitride layer 1502, which remains uniform in the bottom of the opening. Additionally, nitride layer 1503 overlying structure 1504 remains intact. As described above, the temperature of the etch can be varied for the desired taper. For example, an angle 1506 of 85°–90° can be achieved by reducing the helium flow and pressure such that the wafer temperature is elevated as described before. Alternatively, normal cooling can be performed so that the angle 1706 has a taper of less than 85° if desired.

Thus, a method of etching an oxide layer has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of etching an oxide layer comprising the steps of:

providing a substrate having said oxide layer thereon;

depositing a hard mask layer on said oxide layer, wherein said hard mask layer comprises a material selected from the group consisting of silicon nitride, polysilicon, aluminum, a refractory metal, and a refractory metal silicide;

forming a patterning layer on said hard mask layer;

forming a patterning layer opening in said patterning layer to form a hard mask layer exposed region;

forming a hard mask layer opening in said hard mask layer exposed region to form an oxide layer exposed region; and, forming an oxide layer opening in said oxide layer exposed region by exposing said oxide layer exposed region to a plasma.

2. The method as described in claim 1 wherein said patterning layer is removed prior to the completion of said step of forming said oxide layer opening.

3. The method as described in claim 1 wherein said patterning layer is removed prior to the beginning of said step of forming said oxide layer opening.

4. The method as described in claim 2 wherein a plurality of said patterning layers openings, said hard mask layer openings and said oxide layer openings are formed, and wherein a first one of said oxide layer openings has a different aspect ratio from a second one of said oxide layer openings.

5. The method as described in claim 1 wherein said substrate is at a temperature of 110° C. or greater during at least some of said step of forming said oxide layer opening.

6. The method as described in claim 2 wherein said substrate is at a temperature of 110° C. or greater during at least some of said step of forming said oxide layer opening.

7. The method as described in claim 3 wherein said substrate is at a temperature of 110° C. or greater during at least some of said step of forming said oxide layer opening.

8. The method as described in claim 1 wherein said substrate is at a temperature of 130° C. or greater during at least some of said step of forming said oxide layer opening.

9. The method as described in claim 2 wherein said substrate is at a temperature of 130° C. or greater during at least some of said step of forming said oxide layer opening.

10. The method as described in claim 1 wherein said substrate is at a temperature above a reticulation temperature of said patterning layer during at least some of said step of forming said oxide layer opening.

11. The method as described in claim 2 wherein said substrate is at a temperature above a reticulation temperature of said patterning layer during at least some of said step of forming said oxide layer opening.

12. The method as described in claim 1 wherein said substrate comprises a silicon nitride layer underlying said oxide layer.

13. The method as described in claim 2 wherein said substrate comprises a silicon nitride layer underlying said oxide layer.

14. The method as described in claim 5 wherein said plasma is formed in a flow comprising $CH_2F$—$CF_3$.

15. The method as described in claim 6 wherein said plasma is formed in a flow comprising $CH_2F$—$CF_3$.

16. A method of etching an oxide layer comprising the steps of:

providing a substrate having said oxide layer thereon;

forming a masking layer on said Oxide layer, said masking layer being a low carbon content material;

forming a masking layer opening in said masking layer to form an oxide layer exposed region; and, forming an oxide layer opening in said oxide layer exposed region by exposing said oxide layer exposed region to a plasma.

17. The method as described in claim 16 wherein a plurality of said masking layer openings and said oxide layer openings are formed, and wherein a first one of said oxide layer openings has a different aspect ratio from a second one of said oxide layer openings.

18. The method as described in claim 16 wherein said substrate is at a temperature of 110° C. or greater during at least some of said step of forming said oxide layer opening.

19. The method as described in claim 16 wherein said substrate is at a temperature of 130° C. or greater during at least some of said step of forming said oxide layer opening.

20. The method as described in claim 16 wherein said plasma is formed in a flow comprising $CH_2F$—$CF_3$.

21. The method as described in claim 18 wherein said plasma is formed in a flow comprising $CH_2F$—$CF_3$.

22. A method of etching an oxide layer comprising the steps of:

providing a substrate having said oxide layer thereon;

forming a masking layer on said oxide layer;

forming a masking layer opening in said masking layer to form an oxide layer exposed region; and, forming an oxide layer opening in said oxide layer exposed region by exposing said oxide layer exposed region to a plasma, wherein said masking layer does not have significant carbon interaction with said plasma.

23. The method as described in claim 22 wherein a plurality of said masking layer openings and said oxide layer openings are formed, and wherein a first one of said oxide layer openings has a different aspect ratio from a second one of said oxide layer openings.

24. The method as described in claim 22 wherein said substrate is at a temperature of 110° C. or greater during at least some of said step of forming said oxide layer opening.

25. The method as described in claim 22 wherein said substrate is at a temperature of 130° C. or greater during at least some of said step of forming said oxide layer opening.

26. The method as described in claim 22 wherein said plasma is formed in a flow comprising $CH_2F$—$CF_3$.

27. The method as described in claim 24 wherein said plasma is formed in a flow comprising $CH_2F$—$CF_3$.

28. A method of etching an oxide layer comprising the steps of:

providing a substrate having said oxide layer thereon;

exposing a first portion of said oxide layer and covering a second portion of said oxide layer; and, forming an oxide layer opening in said first portion by exposing said first portion to a plasma formed in a gas flow comprising $CH_2F$—$CF_3$.

29. The method as described in claim 28 wherein said substrate comprises a silicon nitride layer underlying said oxide layer.

30. The method as described in claim 28 wherein said step of exposing said first portion and covering said second portion of said oxide layer comprises the steps of:

depositing a masking layer on said oxide layer;

forming a patterning layer on said masking layer;

forming a patterning layer opening in said patterning layer corresponding to said first portion; and, forming a masking layer opening in said masking layer to expose said first portion.

31. The method as described in claim 29 wherein said step of exposing said first portion and covering said second portion of said oxide layer comprises the steps of:

depositing a masking layer on said oxide layer;

forming a patterning layer on said masking layer;

forming a patterning layer opening in said patterning layer corresponding to said first portion; and, forming a masking layer opening in said masking layer to expose said first portion.

32. The method as described in claim 29 wherein said patterning layer is removed prior to the completion of said step of forming said oxide layer opening.

33. The method as described in claim 29 wherein said patterning layer is removed prior to the beginning of said step of forming said oxide layer opening.

34. The method as described in claim 31 wherein a plurality of said patterning layers openings, said masking layer openings and said oxide layer openings are formed, and wherein a first one of said oxide layer openings has a different aspect ratio from a second one of said oxide layer openings.

35. The method as described in claim 28 wherein said masking layer comprises a material selected from the group consisting of polysilicon, aluminum, a refractory metal, and a refractory metal silicide.

36. The method as described in claim 28 wherein said substrate is at a temperature of 110° C. or greater during at least some of said step of forming said oxide layer opening.

37. The method as described in claim 28 wherein said substrate is at a temperature of 130° C. or greater during at least some of said step of forming said oxide layer opening.

38. The method as described in claim 29 wherein said substrate is at a temperature of 110° C. or greater during at least some of said step of forming said oxide layer opening.

39. The method as described in claim 29 wherein said substrate is at a temperature of 130° C. or greater during at least some of said step of forming said oxide layer opening.

40. The method as described in claim 31 wherein said substrate is at a temperature of 110° C. or greater during at least some of said step of forming said oxide layer opening.

41. The method as described in claim 31 wherein said substrate is at a temperature of 130° C. or greater during at least some of said step of forming said oxide layer opening.

42. The method as described in claim 29 wherein said oxide layer opening exposes a corner of a structure, said corner covered with said nitride layer.

43. The method as described in claim 31 wherein said oxide layer opening exposes a corner of a structure, said corner covered with said nitride layer.

44. The method as described in claim 32 wherein said oxide layer opening exposes a corner of a structure, said corner covered with said nitride layer.

45. The method as described in claim 38 wherein said oxide layer opening exposes a corner of a structure, said corner covered with said nitride layer.

46. The method as described in claim 39 wherein said oxide layer opening exposes a corner of a structure, said corner covered with said nitride layer.

47. The method as described in claim 28 wherein said gas flow further comprises $CHF_3$.

48. The method as described in claim 29 wherein said gas flow further comprises $CHF_3$.

49. The method as described in claim 31 wherein said gas flow further comprises $CHF_3$.

50. The method as described in claim 36 wherein said gas flow further comprises $CHF_3$.

51. The method as described in claim 38 wherein said gas flow further comprises $CHF_3$.

52. The method as described in claim 40 wherein said gas flow further comprises $CHF_3$.

53. A method of etching an oxide layer comprising the steps of:

provinding a substrate having said oxide layer thereon;

depositing a masking layer on said oxide layer;

forming a patterning layer on said masking layer;

forming a patterning layer opening in said patterning layer to form a masking layer exposed region;

forming a masking layer opening in said masking layer exposed region to form an oxide layer exposed region;

exposing said oxide layer exposed region to a first plasma;

performing a polymer clean step; and, exposing said oxide layer exposed region to a second plasma.

54. The method as described in claim 53 wherein said polymer clean step is performed by exposing said substrate to a plasma formed in a mixture comprising oxygen.

55. The method as described in claim 53 wherein said polymer clean step is performed by exposing said substrate to a mixture comprising $H_2SO_4$ and $H_2O_2$.

56. The method as described in claim 53 wherein a plurality of said patterning layer openings, said masking layer openings, and said oxide layer openings are formed, and wherein a first one of said oxide layer openings has a different aspect ratio from a second one of said oxide layer openings.

57. The method as described in claim 53 wherein said masking layer comprises a material selected from the group consisting of polysilicon, aluminum, a refractory metal, and a refractory metal silicide.

58. The method as described in claim 53 wherein said substrate is at a temperature of 110° C. or greater during at least some of said step of forming said oxide layer opening.

59. The method as described in claim 53 wherein said substrate is at a temperature of 130° C. or greater during at least some of said step of forming said oxide layer opening.

60. The method as described in claim 53 wherein said second plasma is formed in a gas flow comprising $CH_2F$—$CF_3$.

61. The method as described in claim 57 wherein said second plasma is formed in a gas flow comprising $CH_2F$—$CF_3$.

62. The method as described in claim 58 wherein said second plasma is formed in a gas flow comprising $CH_2F$—$CF_3$.

63. The method as described in claim 59 wherein said second plasma is formed in a gas flow comprising $CH_2F$—$CF_3$.

* * * * *